(12) United States Patent
Moerder

(10) Patent No.: US 6,684,059 B1
(45) Date of Patent: Jan. 27, 2004

(54) FREQUENCY GENERATION IN A WIRELESS COMMUNICATION SYSTEM

(75) Inventor: Karl E. Moerder, Poway, CA (US)

(73) Assignee: Tachyon, Inc., San Diego, CA (US)

( * ) Notice: Subject to any disclaimer, the term of this patent is extended or adjusted under 35 U.S.C. 154(b) by 0 days.

(21) Appl. No.: 09/407,643

(22) Filed: Sep. 28, 1999

Related U.S. Application Data

(60) Provisional application No. 60/151,282, filed on Aug. 27, 1999.

(51) Int. Cl.[7] ............... H04B 7/14; H04B 1/40
(52) U.S. Cl. ............ 455/20; 455/76; 455/84; 455/315; 455/183.1
(58) Field of Search ............... 455/20, 84, 85, 455/86, 76, 313, 314, 317, 91, 105, 73, 180.3, 183.1

(56) References Cited

U.S. PATENT DOCUMENTS

| | | | | |
|---|---|---|---|---|
| 4,491,969 A | * | 1/1985 | Datta | 455/86 |
| 4,761,821 A | * | 8/1988 | Mawhinney et al. | 455/86 |
| 4,961,206 A | * | 10/1990 | Tomlinson et al. | 375/261 |
| 5,388,125 A | * | 2/1995 | Toda et al. | 455/183.1 |
| 5,493,710 A | | 2/1996 | Takahara et al. | |
| 5,566,168 A | * | 10/1996 | Dent | 455/12.1 |
| 5,740,521 A | * | 4/1998 | Hulkko et al. | 455/76 |
| 5,793,819 A | * | 8/1998 | Kawabata | 455/86 |
| 5,940,744 A | | 8/1999 | Uda | |

FOREIGN PATENT DOCUMENTS

| | | |
|---|---|---|
| EP | 0 735 715 A2 | 10/1996 |
| GB | 2 253 750 A | 9/1992 |
| GB | 2 310 966 A | 9/1997 |

* cited by examiner

Primary Examiner—Edward F. Urban
Assistant Examiner—Simon Nguyen
(74) Attorney, Agent, or Firm—Knobbe, Martens, Olson & Bear, LLP

(57) ABSTRACT

A communication system extracts a received modulation frequency from baseband modulation. This frequency is used as a reference to control the output of a variable oscillator. The output of the variable oscillator may be used to generate a transmit upconversion frequency, and may also be used to perform a downconversion from IF to baseband during receive operations.

11 Claims, 6 Drawing Sheets

FREQUENCY GENERATION IN A WIRELESS COMMUNICATION SYSTEM

RELATED APPLICATION

This application claims priority under 35 U.S.C. §119(e) to U.S. Provisional Application No. 60/151,282, entitled FREQUENCY GENERATION IN A WIRELESS COMMUNICATION SYSTEM, filed Aug. 27, 1999, which is herein incorporated by reference.

BACKGROUND OF THE INVENTION

1. Field of the Invention

The invention relates to wireless communication, specifically to retrieving frequency information from a received wireless transmission.

2. Description of the Related Art

Wireless communication has become one of the most common ways of transmitting information from one place to another. The application of wireless communication links to telephone systems, local area computer networks, and wide area computer networks such as the Internet is widespread, and a large number of commercial manufacturers supply wireless communication equipment to these markets.

Some fundamental principles of a conventional wireless communication technique are illustrated in FIG. 1. In some forms of wireless communication, a baseband signal 10, which encodes a selected message, is combined with a high frequency sine wave carrier signal in an upconverter 14. In FM transmission, for example, the frequency of the carrier signal is altered in a way defined by the content of the baseband message signal 10. The modulated carrier 16 is then transmitted, and is received by a downconverter circuit 18 at the appropriate message destination. Both the upconverter 14 and the downconvertor 18 have reference frequency signals 12, 20 as inputs to perform the upconversion and downconversion processes. In some cases, the baseband message signal 22 produced by the downconverter 18 is a reproduction of the original message signal 10, but this need not be the case, as long as the message content is decodable from the downconverter 18 output.

In a broadcast system, such as broadcast television, only a central station will include circuitry for signal transmission. However, for two-way communication between, for example, a central hub and a number of remote units, the hub and the remote units will all include both downconversion circuitry for receive operations, and upconversion circuitry for transmit operations. In this case the remote units must also generate an upconversion reference frequency for message transmission to the hub, although for two-way communication, the carrier frequencies may differ depending on message direction.

In a large number of communication systems such as the one shown in FIG. 1, it is important that the frequency of the upconversion reference signal 12 and the frequency of the downconversion reference signal 20 be consistently and accurately related to one another to produce an easily interpreted downconverter output 22 and to allow optimal use of the allocated frequency. In addition, government regulatory agencies require the frequency of the carrier signal used for transmission to be equal to a specific assigned frequency within a very tight tolerance.

These goals are sometimes achieved by installing highly accurate and stable oscillators at both ends of the link to generate the reference signals 12, 20 at the link ends. One example of such a system for two-way communication is illustrated in FIG. 2. In this system, a signal received by a satellite dish 23 is downconverted by a series of two mixers 24a, 24b. The first mixer 24a may reside in an outdoor mounted unit 26, and downconverts the center frequency of the received signal to an intermediate frequency (IF). The second mixer 24b may reside in an indoor mounted unit 28, and downconverts the IF signal to a modulated baseband output which is sampled by an analog to digital converter 30. The output of the analog to digital converter 30 is routed to digital processing circuitry to demodulate the baseband signal and reproduce the bits which comprise the received data.

During the transmit process, the output of a signal generator 32 is upconverted by another pair of mixers 33a, 34b, the first one of which may be housed in the indoor unit 28, and the second one of which may be housed in another outdoor unit 34.

The mixers each receive a reference frequency signal from an associated phase-locked-loop (PLL) 36a, 36b, 36c, 36d. Each PLL in turn receives a reference frequency from an oscillator 37 from which it derives its output frequency. A controller 38 is coupled to the PLLs for digitally setting internal loop dividers so that each PLL can output a different frequency signal even though they all receive a common reference frequency from the oscillator 37.

In this type of system, the oscillator 37 is free-running, and should be as accurate and stable as possible over time, with temperature variations, etc. Typically, free running oscillators of sufficient quality to serve this function are among the most expensive components of the system. In addition, even with a high quality oscillator, some offset from an ideal reference frequency is present. In some systems, these offsets may be detected by analyzing the characteristics of the baseband receive signal during bit decoding. Deviation from 0 Hz center frequency in the baseband signal is measured, and is attributed to an offset from an ideal output of the oscillator 37. Once this offset is quantified during receive operations, the loop dividers in the transmit PLLs 36b, 36c can be updated to make these PLL outputs accurate even in the presence of the detected oscillator 37 offsets.

In some systems, one end of a two-way communication link can generate appropriate reference frequencies directly from a modulated carrier signal received from the other end of the link. However, the circuitry required to extract a stable reference frequency from a received modulated carrier is also expensive. Thus, less expensive techniques for generating these reference frequencies are needed as wireless communication expands into more widespread use.

SUMMARY OF THE INVENTION

The invention comprises methods and apparatus for frequency generation in communication systems. In one embodiment, a communication device according to the invention comprises upconversion circuitry, downconversion circuitry, and a reference frequency generator. In this embodiment, the reference frequency generator is coupled between an output of the downconversion circuitry and the upconversion circuitry. The reference frequency generator may comprise a voltage controlled oscillator and a phase comparator.

Methods of generating an upconversion frequency signal for a transmitter are also provided. In a wireless communication apparatus comprising a transmitter and a receiver, such a method may comprise extracting a modulation frequency from a signal received by the receiver, and deriving the transmit upconversion frequency from the modulation frequency.

DETAILED DESCRIPTION OF THE PREFERRED EMBODIMENT

Embodiments of the invention will now be described with reference to the accompanying Figures, wherein like numerals refer to like elements throughout. The terminology used in the description presented herein is not intended to be interpreted in any limited or restrictive manner, simply because it is being utilized in conjunction with a detailed description of certain specific embodiments of the invention. Furthermore, embodiments of the invention may include several novel features, no single one of which is solely responsible for its desirable attributes or which is essential to practicing the inventions herein described.

Figure 3:
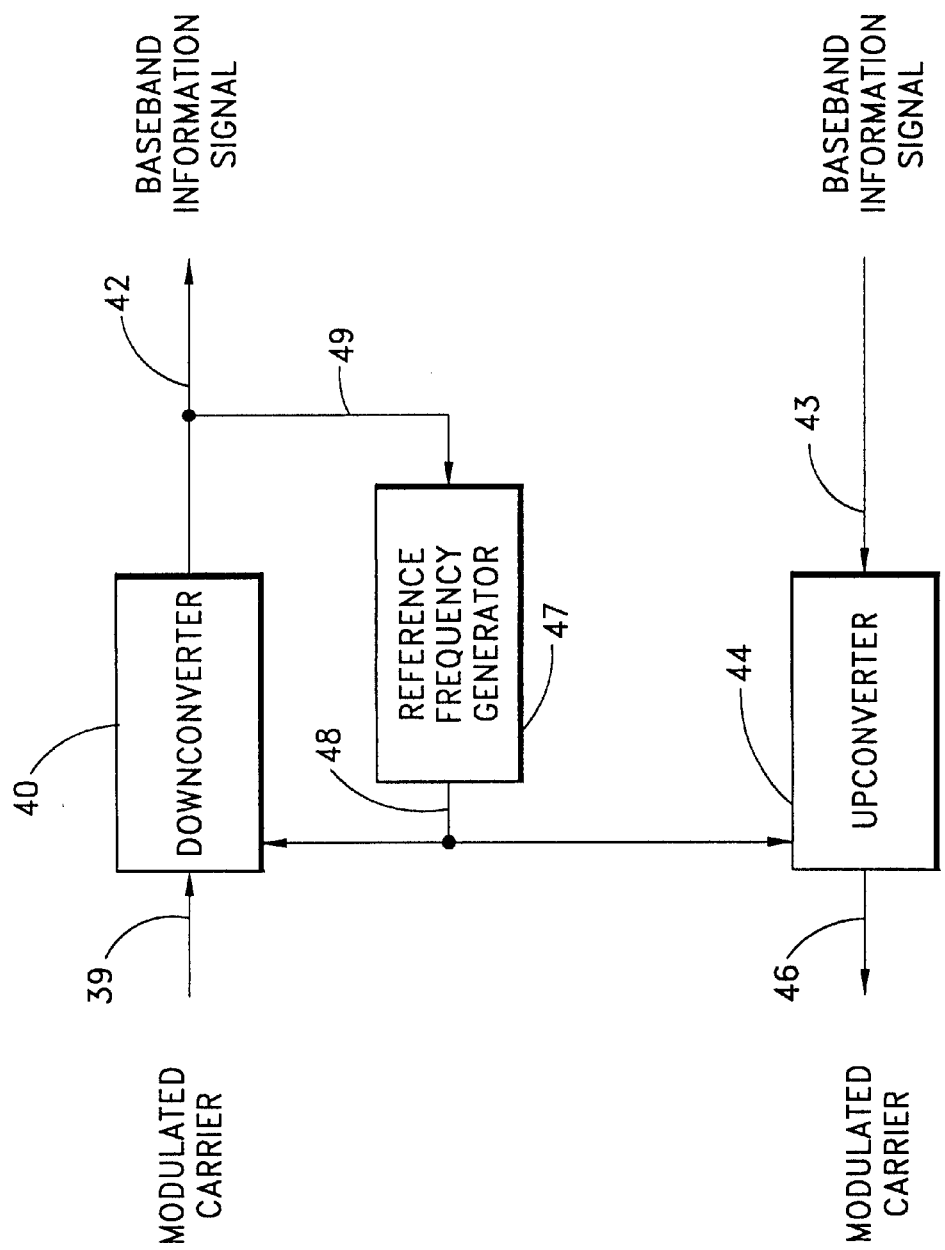
FIG. 3 is a block diagram of a communication channel including a reference frequency generation loop.

FIG. 3 illustrates portions of transmit and receive circuitry in a unit of a two way wireless communication system. When the unit is receiving, an inbound modulated carrier signal 39 is received by a downconverter circuit 40 which produces an inbound baseband information signal 42. When the unit is transmitting, an outbound baseband information signal 43 is fed to an upconverter 44 which produces an outbound modulated carrier 46. In addition, a frequency generator 47 is provided that has a stable and accurate frequency signal output 48. In this embodiment, this stable frequency signal is routed to the upconverter 44, where it can be used to generate an accurate carrier signal. In addition, the output 48 of the reference frequency generator 47 is routed to the downconverter 44, where it can be used to generate the required reference frequency or frequencies for downconversion.

In this embodiment of the invention, the reference frequency generator 47 uses the inbound baseband information signal as an input at line 49. Thus, the baseband signal being received is used as a source of an accurate and stable frequency reference. This is possible because even though the fixed frequency carrier has been removed, the baseband signal is still modulated in a manner which is in part defined by the rate at which data is being received. This rate is fixed to high accuracy when the carrier was originally modulated by the transmitting system.

A wide variety of carrier modulation schemes are known and used. In general, data bits are encoded as, for example, carrier phase shifts, frequency shifts, amplitude shifts, or combinations thereof, and the modulation frequency may be extracted from the baseband signal. In "M-ary" modulation schemes, a selected phase, frequency, and amplitude state of the carrier may constitute an encoding of 2, 4, or even 6 or more bits. In any carrier modulation scheme, however, the received baseband signal will incorporate a modulation frequency which is related to the incoming data rate. In some cases, the modulation frequency will correspond with the "symbol frequency", wherein the symbols are the one or more bits encoded as defined phase, frequency, and/or amplitude states of the carrier. In many systems, the modulation frequency is accurately fixed and stable at some rate between, for example, 1 and 30 MHz, but other frequencies may be used. This modulation frequency comprises a source of incoming timing information that may be advantageously utilized to generate a reference frequency for transmit upconversion as well as downconversion reference frequencies.

Figure 4:
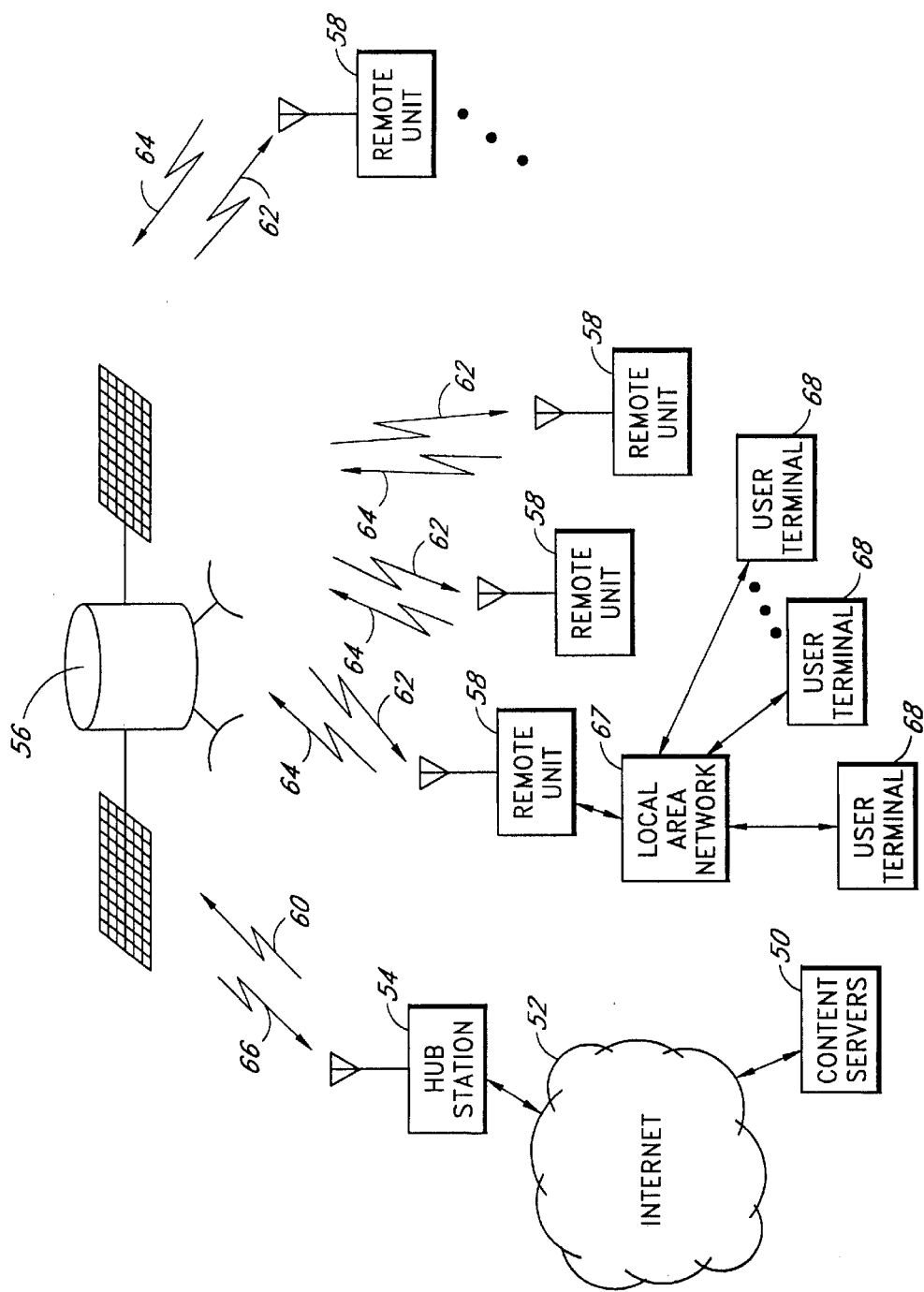
FIG. 4 is a schematic/block diagram of a multiple access wireless communication system in which the invention finds advantageous application.

FIG. 4 is a block diagram illustrating an exemplifying system in which the invention may be embodied. The system in FIG. 4 provides high-speed, reliable Internet communication service over a satellite link. In particular, in FIG. 4, content servers 50 are coupled to the Internet 52 which is in turn coupled to a hub station 54 such that the hub station 54 can request and receive digital data from the content servers 50. The hub station 54 also communicates via satellite 56 with a plurality of remote units 58A–58N. For example, the hub station 54 transmits signals over a forward uplink 60 to the satellite 56. The satellite 56 receives the signals from the forward uplink 60 and re-transmits them on a forward downlink 62. Together, the forward uplink 60 and the forward downlink 62 are referred to as the forward link. The remote units 58A–58N monitor one or more channels which comprise the forward link in order to receive remote-unit-specific and broadcast messages from the hub station 54.

In a similar manner, the remote units 58A–58N transmit signals over a reverse uplink 64 to the satellite 56. The satellite 56 receives the signals from the reverse uplink 64 and re-transmits them on a reverse downlink 66. Together, the reverse uplink 64 and the reverse downlink 66 are referred to as the reverse link. The hub station 54 monitors one or more channels which comprise the reverse link in order to extract messages from the remote units 58A–58N. For example, in one embodiment of the exemplifying system, the reverse link carries multiple access channels in accordance with assignee's co-pending application entitled METHOD AND APPARATUS FOR MULTIPLE ACCESS IN A COMMUNICATION SYSTEM, application Ser. No. 09/407,639, filed concurrently herewith, the entirety of which is hereby incorporated by reference.

In one embodiment of the exemplifying system, each remote unit 58A–58N is coupled to a plurality of system users. For example, in FIG. 3, the remote unit 58A is shown as coupled to a local area network 67 which in turn is coupled to a group of user terminals 68A–68N. The user terminals 68A–68N may be one of many types of local area network nodes such as a personal or network computer, a printer, digital meter reading equipment or the like. When a message is received over the forward link intended for one of the user terminals 68A–68N, the remote unit 58A forwards it to the appropriate user terminal 68 over the local area network 67. Likewise, the user terminals 68A–68N can transmit messages to the remote unit 58A over the local area network 67.

In one embodiment of the exemplifying system, the remote units 58A–58N provide access to the Internet for a plurality of users. For example, assume that the user terminal 68A is a personal computer which executes browser software in order to access the World Wide Web. When the browser receives a request for a web page or embedded object from the user, the user terminal 68A creates a request message according to well-known techniques. The user terminal 68A forwards the request message over the local area network 67 to the remote unit 58A, also using well-known techniques. Based upon the request message, the remote unit 58A creates and transmits a wireless link request over a channel within the reverse uplink 64 and the reverse downlink 66. The hub station 54 receives the wireless link request over the reverse link. Based upon the wireless link request, the hub station 54 passes a request message to the appropriate content server 50 over the Internet 52.

In response, the content server 50 forwards the requested page or object to the hub station 54 over the Internet 52. The hub station 54 receives the requested page or object and creates a wireless link response. The hub station transmits the wireless link response over a channel within the forward uplink 60 and forward downlink 62. For example, in one embodiment of the exemplifying system, the hub station 54 operates in accordance with assignee's co-pending application entitled TRANSMISSION OF TCP/IP DATA OVER A WIRELESS COMMUNICATION CHANNEL, application Ser. No. 09/407,646, and assignee's co-pending application entitled METHOD AND SYSTEM FOR FREQUENCY SPECTRUM RESOURCE ALLOCATION, application Ser. No. 09/407,645, each of which is filed concurrently herewith and the entirety of which is hereby incorporated by reference.

The remote unit 58A receives the wireless link response and forwards a corresponding response message to the user terminal 68A over the local area network 67. In one embodiment of the exemplifying system, the process of retrieving a web page or object is executed in accordance with assignee's co-pending application entitled DISTRIBUTED SYSTEM AND METHOD FOR PREFETCHING OBJECTS, application Ser. No. 09/129,142, filed Aug. 5, 1998, the entirety of which is hereby incorporated by reference. In this way, a bi-directional link between the user terminal 68A and the content servers 50 is established.

The frequency generation of the invention is advantageously incorporated into one or more of the remote units 58A–58N of FIG. 4. This embodiment of a remote unit is illustrated in more detail in FIG. 5.

Referring now to this Figure, the circuitry used for the wireless receive and transmit functions are housed in separate units, one or more of which are provided outdoors, known as "outdoor units" 72, 74, and one or more of which are provided indoors, known as "indoor units" 90. A satellite dish 70 is used to transmit and receive signals via a satellite transponder. The satellite dish is coupled to transmit and receive circuitry which is located in close proximity to the satellite dish 70. In one embodiment, the satellite dish 70 is located on the roof of a building and outdoor units 72, 74 are mounted directly to the satellite dish 70 assembly on the exterior of the building. A receive outdoor unit 74 comprises a low noise amplifier 76 and downconverting mixer 78 which are located in close proximity to the satellite dish 70. This helps reduce the path loss from the satellite dish 70 to the amplifier 76 and preserves the system noise figure. A transmit outdoor unit 72 comprises an upconverting mixer 82 and power amplifier 84 which are also located in close proximity to the satellite dish 70 in order to reduce the path loss between the power amplifier 84 and the satellite dish 70 and avoid increasing the required output of the power amplifier 84.

The system further includes an indoor unit 90 comprising circuitry which need not be located in close proximity to the satellite dish 70. In one embodiment, the indoor unit is located at a convenient position which allows more ready access by the system administrator. The indoor unit 90 is connected to the outdoor units 72, 74 by cabling 92.

Although not necessary to the practice of the invention, the division of the communication unit into outdoor units 72, 74 and an indoor unit 90 allows them to be separately manufactured and factory tested. For example, the outdoor units 72, 74 are preferably manufactured by an RF design house. The indoor unit 90 is preferably manufactured by a company which specializes in communications. In one embodiment, the indoor unit 90 is designed to be compatible with a variety of different outdoor units which operate at a variety of different frequencies and which are manufactured by a variety of different vendors. When in place in the field, the outdoor units 72, 74 and indoor unit 90 can be separately serviced, replaced or upgraded. In other embodiments, one or more outdoor units may house more functionality than that illustrated in FIG. 5.

The satellite dish 70 is coupled to an orthomode transducer (OMT) 92 or other device for providing separation of the transmit and receive signal energy. The OMT 92 couples the receive signals from the satellite dish 70 to the low noise amplifier 76. The OMT 92 also couples transmit signals from the power amplifier 84 to the satellite dish 70. As described briefly above, the low noise amplifier 76 is coupled to a mixer 78 which downconverts the received signal to an intermediate frequency. The output of the mixer 78 is coupled to the indoor unit 90 via the cable 92. Within the indoor unit 90, receive signal processing is performed which is described further below. A controller 96 in the indoor unit provides control over indoor and outdoor transmit and receive circuits.

During the transmit process, under the control of the controller 96, a signal generator 98 receives digital data from system users and encodes the data for transmission. The signal generator 98 also generates a modulated baseband message signal. This baseband signal is mixed with an IF signal by a mixer 100, and the modulated IF output signal from the mixer 100 is coupled to a variable gain amplifier 102. The gain of the variable gain amplifier 102 is controlled by the controller 96. The output IF signal from the variable gain amplifier 96 is passed over the cable 92 to the outdoor unit 72.

Within the outdoor unit 72, the mixer 82 upconverts the IF signal to a RF frequency suitable for transmission. For example, in one embodiment, the RF center frequency is within the Ku band, Ka band or any other suitable band. The output of the mixer 82 is input into the power amplifier 84. The power amplifier 84 may, for example, comprise a Class A amplifier. When enabled, the power amplifier 84 outputs a high power RF signal to the satellite dish 70 via the OMT 92.

In many applications, the modulated carrier received by the satellite dish has a center frequency of 10–12 GHz. This is downconverted to produce an approximately 1 GHz intermediate frequency (IF) signal by combining the 10–12 GHz input signal with an approximately 9–11 GHz reference signal generated by a free-running oscillator 144 and by filtering with a lowpass or bandpass filter 108. The IF signal is further downconverted to a baseband signal (nominally 0 Hz center frequency) by a second mixer 110 and is further filtered with low pass filter 112. The baseband signal is sampled by an analog to digital converter 114. The digital samples output from the analog to digital converter 114 are routed to a demodulator 116 to reconstruct the transmitted bit stream.

Both the transmit and receive processes require the production of reference signals for translating a baseband signal to a high frequency modulated carrier for transmission and for translating from a received high frequency modulated carrier to a baseband signal. These reference signals are generated by phase or frequency-locked loops (PLLs) 120, 122, 124 associated with mixers 82, 100, 110. The phase-locked loops include internal programmable loop dividers, and are configured to produce an output signal having a frequency which is typically equal to the frequency of an input signal times a selected integer ratio p/q. The selected ratio is digitally controllable by the controller 96 by setting loop divider values in the phase-locked-loops.

Figure 1:
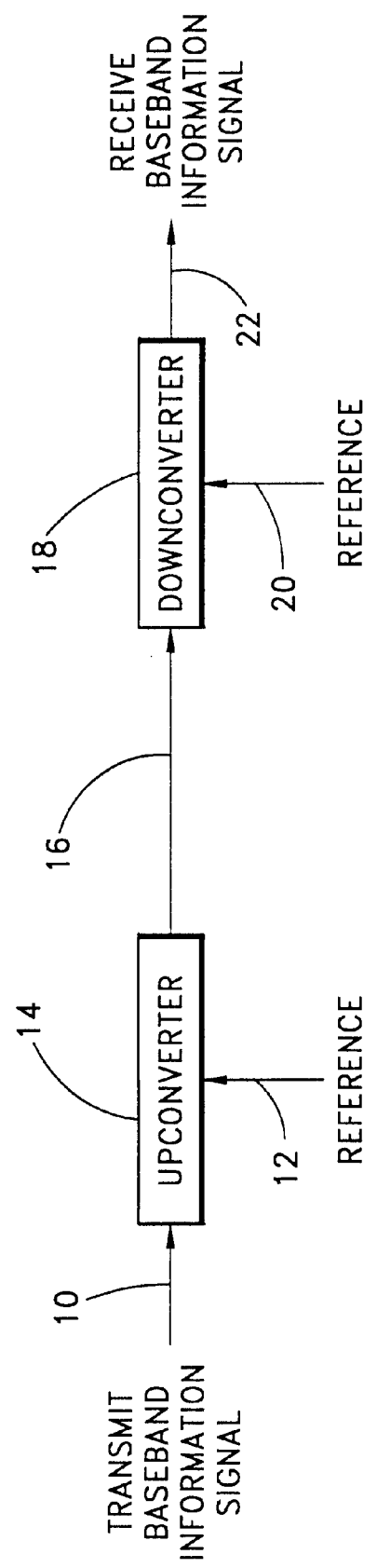
FIG. 1 is a block diagram of a communication channel.
Figure 2:
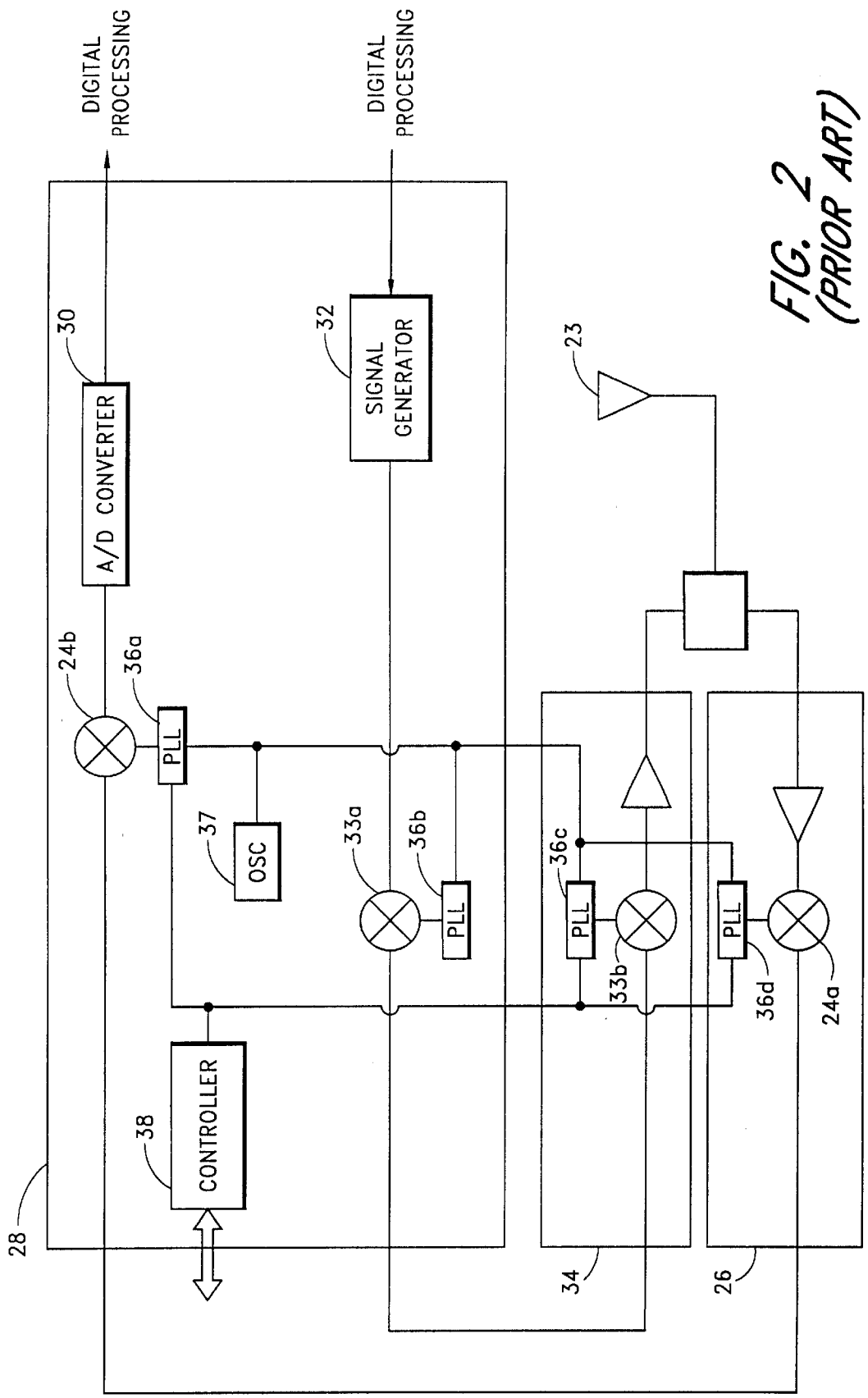
FIG. 2 is a block diagram of one end of a two-way wireless communication link.

It is important that the output of the transmit phase-pocked-loops 120, 122 be accurate and stable so that the transmit carrier frequency is also accurate and stable. As described above with reference to FIG. 2, in conventional communication systems, this had often been accomplished by providing an expensive free running oscillator coupled to the PLL 120, 122 inputs, and correcting any remaining oscillator offsets by analyzing the downconverted baseband signal during receive operations. In the embodiment of the invention illustrated in FIG. 5, however, this expensive construction is unnecessary. Instead, the input of the PLLs 120, 122 is from a locked variable oscillator 130. In some advantageous embodiments, the variable oscillator 130 comprises a voltage controlled oscillator.

The output frequency of the voltage controlled oscillator 130 may be set to a tight tolerance by locking it to the received modulation frequency. In this embodiment, this may be done by routing the digital samples from the analog to digital converter 114 to a modulation frequency extractor 132. The modulation frequency extractor 132 processes the sample values to monitor the baseband modulation. The modulation frequency extractor 132 uses this information to generate an analog output signal which has a frequency tied to the received modulation frequency. It will be understood that the baseband modulation may have a variety of frequency components which are not equal to the symbol frequency or bit rate but which may be related to the received symbol frequency in various predefined ways. Any of these modulation frequency components could be extracted by the modulation frequency extractor 132. In fact, during the baseband demodulation process performed by the demodulator 116, timing signals related to the bit rate and/or modulation frequency are typically already generated. In these embodiments, the modulation frequency extractor 132 is part of the already existing demodulator 116.

This analog output of the modulation frequency extractor 132 provides one input to a phase comparator 134 through a loop divider 135. The phase comparator 134 also receives a second input from the voltage controlled oscillator 130 through another loop divider 136. The output of the phase comparator 134 is filtered with a low pass filter 138 and is then routed as an input to the voltage controlled oscillator 130. With this closed loop control, the output frequency of the voltage controlled oscillator 130 will be equal to the frequency of the output of the modulation frequency extractor 132 times an integer ratio which is determined by the settings of the two loop dividers 135, 136, which may be digitally set by the controller 96. It is generally advantageous to have the cutoff frequency of the filter 138 be much lower than the modulation frequency so that the output of the voltage controlled oscillator 130 is based on a relatively long term running average of the received modulation frequency. Although one particular circuit is illustrated for purposes of explanation, it will be appreciated by those of skill in the art that a variety of known phase locked loop designs, frequency locked loop designs, or other signal synthesizer circuits may be used to lock a reference frequency to the output of the modulation frequency extractor 132.

Because data may be received at a variety of different nominal rates, the loop dividers 135, 136 can be updated by the controller 96 based on the current nominal data rate. In this way, the output frequency of the voltage controlled oscillator 130 can be held constant even though the system may be used with different incoming data rates. The output of the voltage controlled oscillator 130 is then used as an input to the PLLs 120, 122 which provide the frequencies for upconverting the baseband modulated signal for output by the satellite dish 70. As is also shown in FIG. 5, the output of the voltage controlled oscillator 130 can be used as an input to the PLL 124 which is used to downconvert the IF signal to baseband.

It is one advantage of this embodiment of the invention that it is possible to use an outdoor receive unit 74 which incorporates a free-running oscillator 144 as its frequency reference for downconversion to IF. Free running downconverters of this nature are mass produced for the satellite television broadcast market, and are very inexpensive. However, they have not been utilized in two-way digital data communication applications. Instead, custom made and relatively expensive outdoor units are used. One reason for this is that a free running oscillator at the downconversion to IF step produces an unquantifiable downconversion error. This makes it impossible to correct for frequency offsets in a separate oscillator (such as that designated 37 in FIG. 2) which provides the reference for transmit upconversion, because a measure of downconversion error was used to quantify oscillator offsets. The embodiment of FIG. 5 does not share this deficiency because the reference frequency standard is provided by the baseband modulation, which is unaffected by errors in a free-running oscillator 144 in the outdoor receive unit 74.

Figure 5:
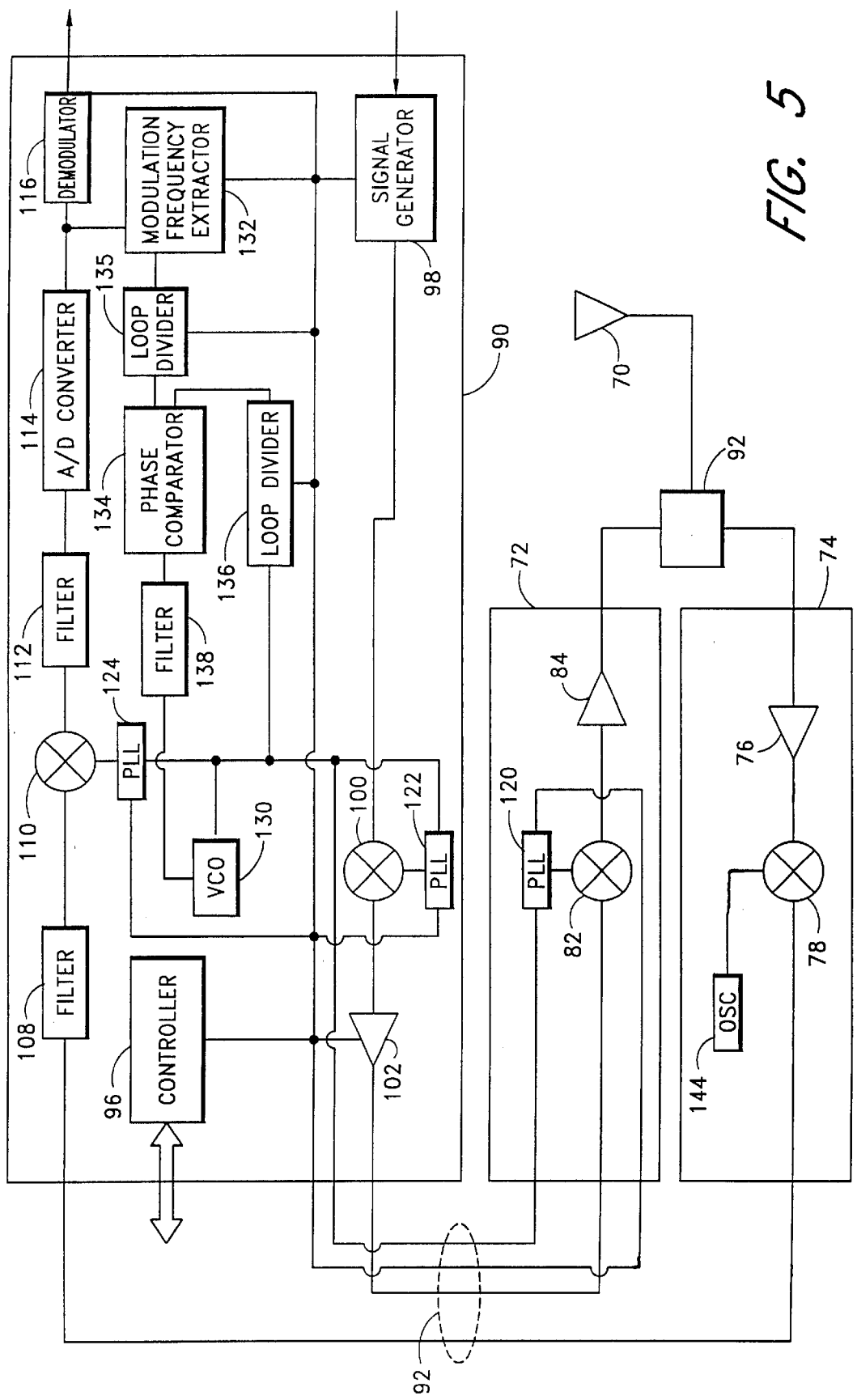
FIG. 5 is a schematic/block diagram of wireless reception and transmission circuitry according to one embodiment of the invention which may be provided in one of the remote units of FIG. 4.

In addition, the embodiment of FIG. 5 allows for the correction of downconversion errors in the receive process due to an inaccurate free-running oscillator 144. These errors can be detected in the demodulation process performed by the demodulator 116, and the controller can adjust the loop dividers in the PLL 124 associated with the second receive downconversion to compensate for these errors.

Figure 6:
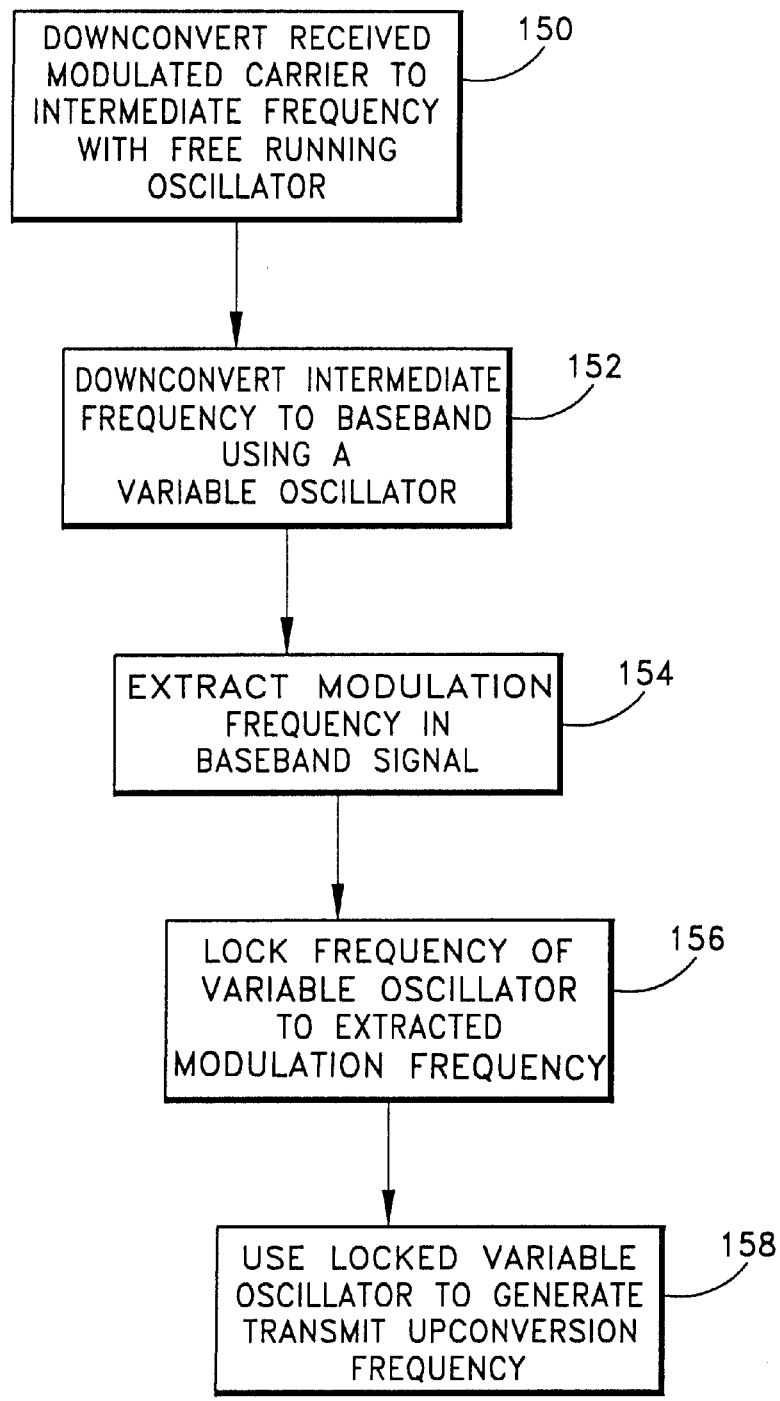
FIG. 6 is a flowchart of a method of reference frequency generation according to one embodiment of the invention.

Referring now to FIG. 6, one embodiment of the invention therefore operates by first, at block 150, downconverting a received modulated carrier signal to an intermediate frequency using a free running oscillator. Next, at block 152, the intermediate frequency signal is downconverted to a baseband signal using a variable oscillator. At block 154, this baseband signal is analyzed and a modulation frequency is extracted. At block 156, the output frequency of the variable oscillator is locked to the extracted modulation frequency. At step 158, the locked variable oscillator is used to generate a transmit upconversion frequency.

Therefore, a modulation frequency, which is extractable from the received baseband modulation, is highly accurate and stable, and may be used as a reference for upconversion and downconversion processes. The use of modulation frequency for this purpose allows cost reduction by eliminating the need for high cost internal oscillators. With the invention, it is possible to use a free-running oscillator for downconversion to IF. Such free-running downconverters are mass produced for the broadcast television industry, and are very inexpensive, but have not been utilized in the high speed two-way digital data communication environment.

The invention may be embodied in other specific forms without departing from its spirit or essential characteristics. The described embodiment is to be considered in all respects only as illustrative and not restrictive and the scope of the invention is, therefore, indicated by the appended claims rather than the foregoing description. All changes which come within the meaning and range of equivalency of the claims are to be embraced within their scope.

What is claimed is:

1. A communication apparatus comprising:
    downconversion circuitry having an input comprising a modulated carrier signal and an output comprising a first signal derived from modulation of said carrier signal and related to a symbol or bit rate carried on said modulated carrier signal, said downconversion circuitry also comprising a free running oscillator having an output coupled to a mixer to perform a conversion of said carrier signal to an intermediate frequency;
    a reference frequency generator comprising:
        a variable oscillator, wherein said reference frequency generator has said first signal as an input, and wherein said variable oscillator has an output frequency derived from said first signal; and
        a phase comparator having a modulation frequency signal as a first input and said variable oscillator output as a second input; and
    upconversion circuitry having an input comprising said variable oscillator output frequency.

2. The communication apparatus of claim 1, wherein said variable oscillator output is also coupled to said downconversion circuitry.

3. The communication apparatus of claim 1, wherein said variable oscillator comprises a voltage-controlled-oscillator.

4. The communication apparatus of claim 1, wherein said phase comparator has an output coupled through a low pass filter to an input of said variable oscillator.

5. A communication device, comprising:
    upconversion circuitry;
    downconversion circuitry comprising a free running oscillator for frequency downconversion; and
    a reference frequency generator comprising:
        a variable oscillator; and
        a phase comparator having a first input coupled to said output of said downconversion circuitry and having a second input coupled to an output of said variable oscillator;
        wherein said reference frequency generator is coupled between an output of said downconversion circuitry and said upconversion circuitry, and wherein said reference frequency generator derives a reference frequency from a modulation frequency related to a symbol frequency or the bit rate of a signal received by said downconversion circuitry.

6. The communication device of claim 5, wherein said variable oscillator comprises a voltage-controlled oscillator.

7. The communication device of claim 5, wherein said phase comparator comprises an output coupled to said variable oscillator so as to control the output frequency of said variable oscillator.

8. A wireless communication apparatus comprising:
    a receiver;
    a transmitter;
    a modulation frequency extractor coupled to said receiver and having an output signal derived from said modulation frequency as an output, wherein said modulation frequency is related to the symbol frequency or bit rate of a received signal;
    means for generating a variable frequency reference signal;
    means for locking said variable frequency reference signal to said output signal of said modulation frequency extractor;
    means for generating a transmit upconversion signal from said variable frequency reference signal;
    means for generating a free running reference signal; and
    means for generating a downconversion signal from said free running frequency reference.

9. The wireless communication apparatus of claim 8, wherein said means for generating a variable frequency reference signal comprises a voltage-controlled-oscillator.

10. The wireless communication apparatus of claim 9, wherein said means for locking said variable frequency reference comprises a phase comparator having said output signal of said modulation frequency extractor as a first input and said variable frequency reference signal as a second input.

11. In a wireless communication apparatus comprising a transmitter and a receiver, a method of generating a transmit upconversion frequency for use by said transmitter and a receive downconversion frequency for use by said receiver comprising:
    extracting a modulation frequency from a signal received by said receiver, wherein said modulation frequency is related to the symbol frequency or bit rate of a received signal;
    deriving said transmit upconversion frequency from said modulation frequency; and
    deriving said receive downconversion frequency from a separate free running oscillator.

* * * * *